United States Patent
Zhong et al.

(10) Patent No.: US 9,293,673 B2
(45) Date of Patent: Mar. 22, 2016

(54) SEMICONDUCTOR LIGHT-EMITTING DEVICE PREVENTING METAL MIGRATION

(71) Applicant: XIAMEN SANAN OPTOELECTRONICS TECHNOLOGY CO., LTD., Xiamen (CN)

(72) Inventors: Zhibai Zhong, Xiamen (CN); Shuiqing Li, Xiamen (CN); Jianjian Yang, Xiamen (CN); Chanyuan Zhang, Xiamen (CN); Charles Siu-Huen Leung, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/639,996

(22) Filed: Mar. 5, 2015

(65) Prior Publication Data

US 2015/0179893 A1 Jun. 25, 2015

Related U.S. Application Data

(63) Continuation of application No. PCT/CN2013/084302, filed on Sep. 26, 2013.

(30) Foreign Application Priority Data

Sep. 29, 2012 (CN) .......................... 2012 1 0372376

(51) Int. Cl.
| | |
|---|---|
| *H01L 33/60* | (2010.01) |
| *H01L 33/46* | (2010.01) |
| *H01L 27/15* | (2006.01) |
| *H01L 33/38* | (2010.01) |
| *H01L 33/40* | (2010.01) |

(52) U.S. Cl.
CPC .............. *H01L 33/60* (2013.01); *H01L 27/156* (2013.01); *H01L 33/382* (2013.01); *H01L 33/405* (2013.01); *H01L 33/46* (2013.01); *H01L 2933/0016* (2013.01); *H01L 2933/0025* (2013.01); *H01L 2933/0058* (2013.01)

(58) Field of Classification Search
CPC ................... H01L 51/0097; H01L 2251/5338; H01L 27/28; H01L 27/283; H01L 27/32
USPC ......... 257/59, 72, 40, 797, E51.018, E51.022
See application file for complete search history.

(56) References Cited

U.S. PATENT DOCUMENTS

| | | | |
|---|---|---|---|
| 7,659,553 B2 * | 2/2010 | Kato et al. ....................... | 257/98 |
| 2008/0042145 A1 * | 2/2008 | Hagleitner et al. ............. | 257/79 |
| 2011/0084306 A1 * | 4/2011 | Jeong .............................. | 257/99 |

FOREIGN PATENT DOCUMENTS

CN 102646765 A 8/2012

*Primary Examiner* — Su C Kim
*Assistant Examiner* — David S Wilbert
(74) *Attorney, Agent, or Firm* — Syncoda LLC; Feng Ma (57) ABSTRACT

A semiconductor light-emitting device is configured to prevent or reduce metal migration. The device includes: an n-type semiconductor layer, a light-emitting layer, and a p-type semiconductor layer; a reflecting layer disposed over the p-type semiconductor layer and containing a metal that tends to migrate; a well ring structure at the p-type semiconductor layer and substantially surrounding the reflecting layer to prevent the metal from migrating towards a side wall of the device; and a metal coating layer over the reflecting layer and extending towards the well ring structure to form an ohmic contact with the p-type semiconductor of the entire well ring structure. The device reliability is improved as the p-type semiconductor layer forms a well ring structure have "pining" effect surrounding the reflecting layer, thereby preventing the metal from migrating towards the device edge along the contact surface between the reflecting layer and the p-type semiconductor.

16 Claims, 12 Drawing Sheets

SEMICONDUCTOR LIGHT-EMITTING DEVICE PREVENTING METAL MIGRATION

CROSS-REFERENCE TO RELATED APPLICATIONS

The present application is a continuation of, and claims priority to, PCT/CN2013/084302, filed Sep. 26, 2013, which claims priorities to Chinese Patent Application No. CN 201210372376.6, filed Sep. 29, 2012. The disclosures of the above applications are hereby incorporated by reference in their entirety.

BACKGROUND

Silver (Ag) has such advantages as excellent conductivity, conductivity of heat, weldability, low contact resistance and high reflectivity in visible light region. Therefore, use of Ag and Ag alloy which have extremely high reflectivity in visible light region, can greatly improve the luminous efficiency of LED for preparation of reflector. However, Ag is vulnerable to electromigration. In LED, the chip side is a p-n interface area, and its potential gradient is higher than other areas. Therefore, Ag tends to migrate towards the p-n interface of chip side, resulting in gradient distribution path, which greatly influences LED efficiency and stability. Under extra electric field and corresponding humidity sensing environment (whether in metal or other alloy status, e.g., CuAg, AgPd or SnAg) will transfer to Ag+ ion and generate another metallic silver area after original structure migration of surface material and deposition. This metallic silver area, if on the surface of an electronic device, will grow into dendritic or "whisker-shaped" conductive path, resulting in short circuit between the electrons.

Figure 1:
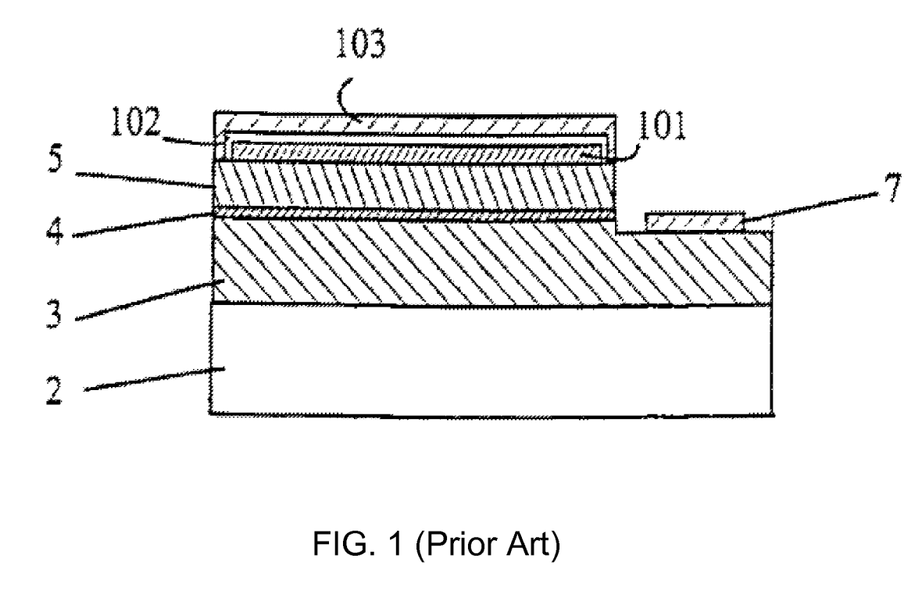
FIG. 1 is a schematic diagram of a structure that inhibits metal migration according to U.S. Pat. No. 6,194,743, where a dense barrier layer clads the reflecting layer to prevent the metal diffusion and migration.

In order to prevent Ag diffusion and electromigration, in general, one or several barrier layers cover on the reflecting layer to block Ag migration (see, e.g., U.S. Pat. No. 6,194,743B1, the disclosure of which is hereby incorporate by reference in its entirety). FIG. 1 illustrates a cross-sectional view of such an LED, including a sapphire substrate 2, an n-layer 3, an active layer 4, and a p-layer 5. An n-electrode 7 is provided in the conventional manner. Silver layer 101 is covered with a diffusion barrier layer 102. Diffusion barrier layer 102 is covered by the bonding layer 103 to which wire or other bonding connections are made. However, the barrier effect is not satisfactory as the Ag is easily diffused and generates electromigration at the chip edge, resulting in chip failure.

SUMMARY

The present disclosure provides a semiconductor light-emitting device, which can effectively prevent metal migration and extend service life of the device.

To achieve the above objectives, the technical approaches of various embodiments described below may include: a semiconductor light-emitting device preventing metal migration, comprising a multi-layer light-emitting structure comprising an n-type semiconductor layer, a light-emitting layer, a p-type semiconductor layer; a reflecting layer over the p-type semiconductor layer containing easy-migrating metal; a well ring structure, forming over the p-type semiconductor layer and surrounding the reflecting layer to prevent the metal of the reflecting layer from migrating towards the side wall; a metal coating layer, covering on the reflecting layer and extending towards the well ring structure.

In the present disclosure, the device reliability is improved as the p-type semiconductor layer forms a well ring structure, which surrounds the reflecting layer, so as to form "pining" effect surrounding the reflecting layer, thus preventing the metal of the reflecting layer from migrating towards the device edge along the contact surface between the reflecting layer and the P-type semiconductor.

Further, in the present disclosure, the P-type semiconductor forms a well ring structure based on size of the reflecting layer; the well ring structure is not deeper than 150 nm and not wider than 20 µm. The well ring structure at least comprises a reflecting layer surrounded by one well ring or several well rings. The P-layer resistance inside the well ring is higher than the P-layer resistance outside the well ring. The well ring structure surrounds the reflecting layer. The reflecting layer can cover on the well ring structure but not beyond its surrounding. In some embodiments, adjustment of resistivity of different well rings can further reduce the Ag migration density.

In some embodiments, the well ring structure forms in the groove structure of the P-type semiconductor. The groove structure is filled with insulating material layer or metal layer easy for eutectic melting with the reflecting layer.

In some embodiments, the metal coating layer, about 200 nm-2000 nm thick, fills in the well ring structure and forms good ohmic contact with the entire p-type semiconductor layer. The material can be Ti, Pt, W, Au, Ni, Sn and Cr or any of their combinations.

In another aspect, a lighting system is provided including a plurality of the semiconductor light-emitting device. A method of fabrication is also provided. Other features and advantages of various embodiments will be described in detail below. The purposes and other advantages of various embodiments can be realized and obtained in the structures specifically described in the specifications, claims and drawings.

DETAILED DESCRIPTION

The following embodiments disclose a semiconductor light-emitting device preventing metal migration. The light-emitting device comprises a multi-layer light-emitting structure, comprising an n-type semiconductor layer, a light-emitting layer and a p-type semiconductor layer over the substrate, which forms a ring structure over the p-type semiconductor layer and forms a metal reflecting layer surrounded by the well ring protection structure. In some embodiments, dense insulating material can be fabricated inside the well ring to block electric field of the reflecting layer. Cover a dense metal layer on the entire reflecting layer and extend towards the well ring structure for high-temperature melting to form ohmic contact between the P-type semiconductor of the entire well ring structure and the metal layer, so as to form "pining" effect surrounding the Ag reflecting layer and prevent Ag migration.

Various embodiments of the present disclosure will be described in detail with reference to the accompanying figures and preferred embodiments.

Figure 2:
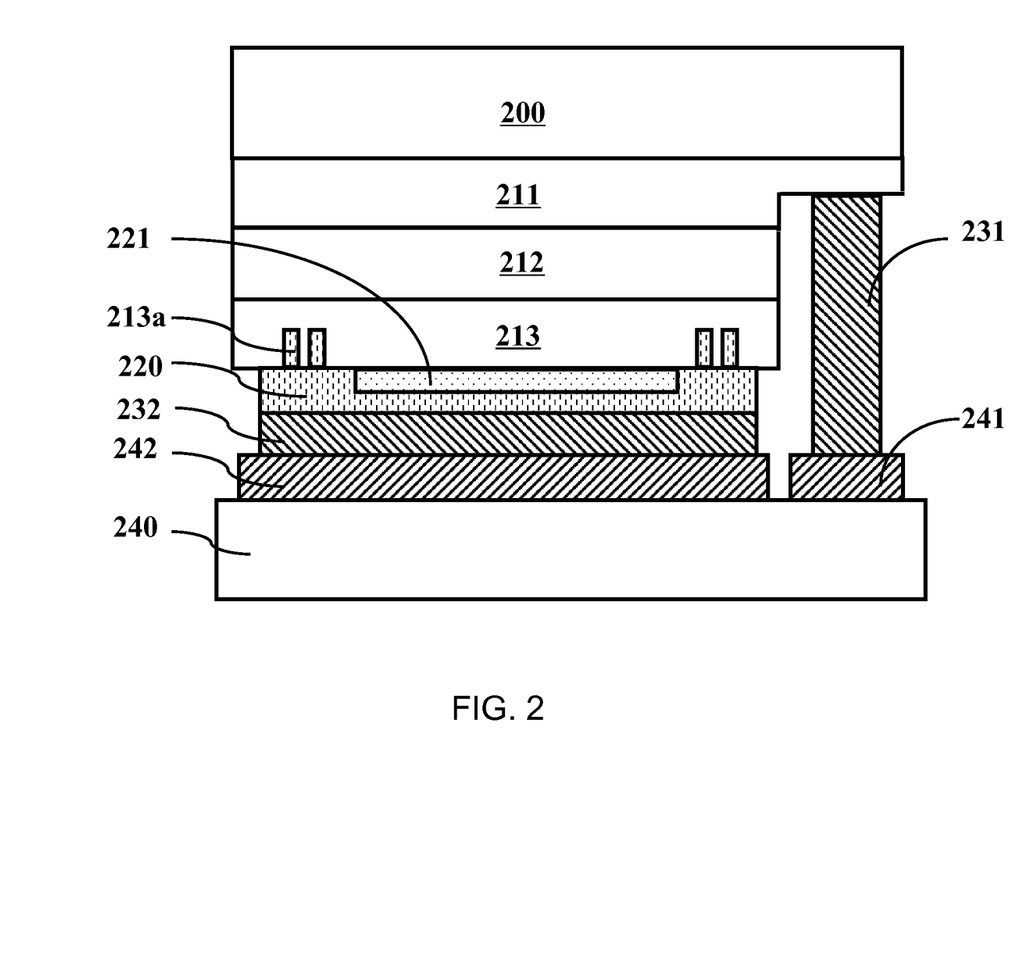
FIG. 2 is a schematic diagram of a light-emitting device preventing metal migration according to some embodiments.

With reference to FIG. 2, a flip-chip semiconductor light-emitting device; the multi-layer light-emitting structure comprises an n-type semiconductor layer 211, a light-emitting layer 212 and a p-type semiconductor layer 213 and is flip-chip mounted over the supporting substrate 240. The supporting substrate 240 is distributed with patterned metal layers 241 and 242; the n-type semiconductor layer 211 and the p-type semiconductor layer 213 of the multi-layer light-emitting structure are connected with the metal layers 241 and 242 of the supporting substrate 240 through the n electrode 231 and the p electrode 232 respectively. An Ag reflecting layer 221 is arranged between the p-type semiconductor layer 213 and the p electrode 232, which contacts with the p-type semiconductor layer 213; the p-type semiconductor layer 213 forms a well ring structure 213a surrounding the reflecting layer 221. The Ag reflecting layer 221 is about 50 nm-500 nm thick. The material is Ni/Ag/Ti/Pt preferably and can be metal layer comprising one or two elements of Ti, Pt, W, Al, Au, Ni, Sn and Cr. The well ring structure at least comprises a well ring and preferably comprises two and more well rings not deeper than 150 nm and not wider than 20 µm. The resistivity inside the well ring is higher than the resistivity outside the well ring. For a multi-well ring structure, adjustment of resistivity of different well rings can further reduce the Ag migration density. Cover a metal coating layer 220 on the entire Ag reflecting layer 221 and extend towards the well ring structure. If the well ring structure is a groove structure, fill in towards the groove to form ohmic contact between the P-type semiconductor of the entire well ring structure and the metal coating layer after high-temperature melting so as to form "pining" effect surrounding the Ag reflecting layer and prevent Ag migration.

Detailed descriptions will be given to the fabrication method of the semiconductor light-emitting device preventing metal migration with reference to FIGS. 8-12.

Figure 8:
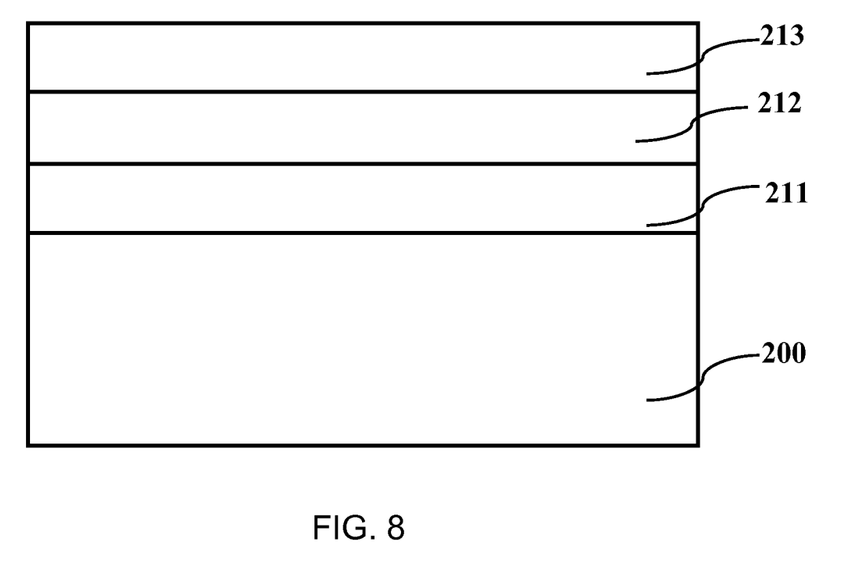
FIG. 8 is a schematic diagrams of a first step for fabricating the light-emitting device of Embodiment 2.

With reference to FIG. 8, grow an n-type semiconductor layer 211, a light-emitting layer 212 and a p-type semiconductor layer 213 to form a multi-layer light-emitting structure via epitaxial growth over the growth substrate 200, wherein, the epitaxial wafer material comprises a compound made of two or more elements from Ga, In, Al, P, N and As.

Figure 9:
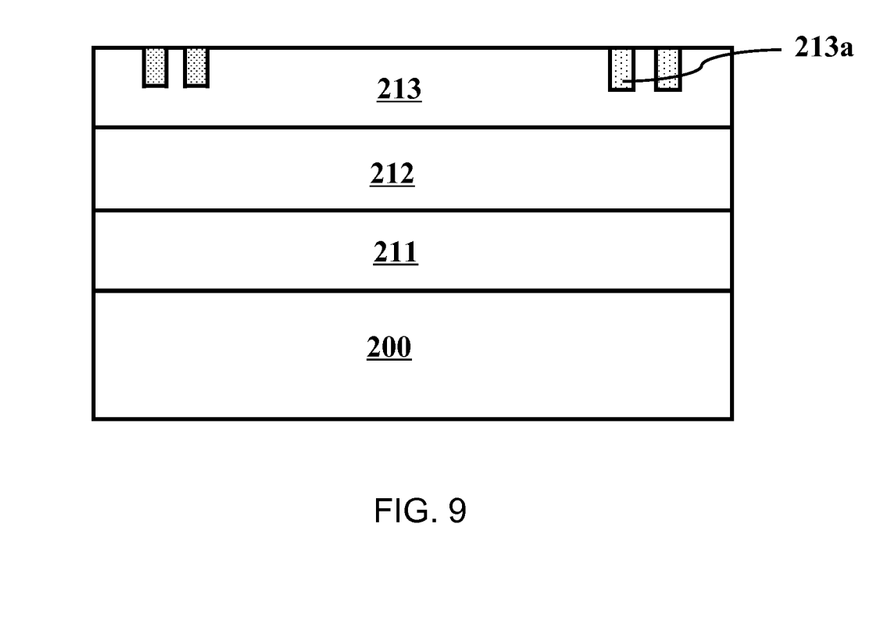
FIG. 9 illustrates a second step.

With reference to FIG. 9, define position of the reflecting layer and form a high-resistance structure in the region where the p-type semiconductor layer 213 surrounds the reflecting layer via ion injection so as to form a well ring structure 213a. The P-layer resistance inside the well ring is higher than the P-layer resistance outside the well ring.

Figure 10:
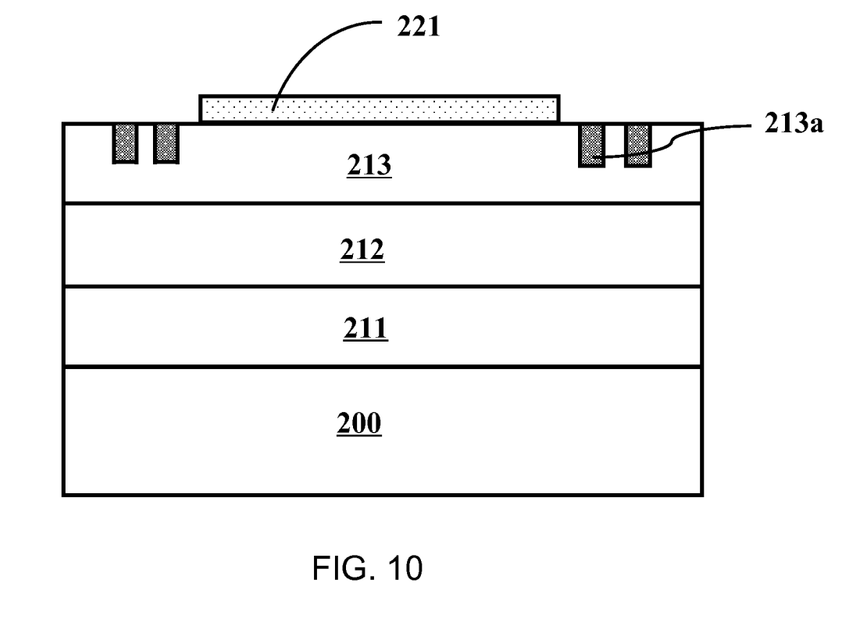
FIG. 10 illustrates a third step.
Figure 11:
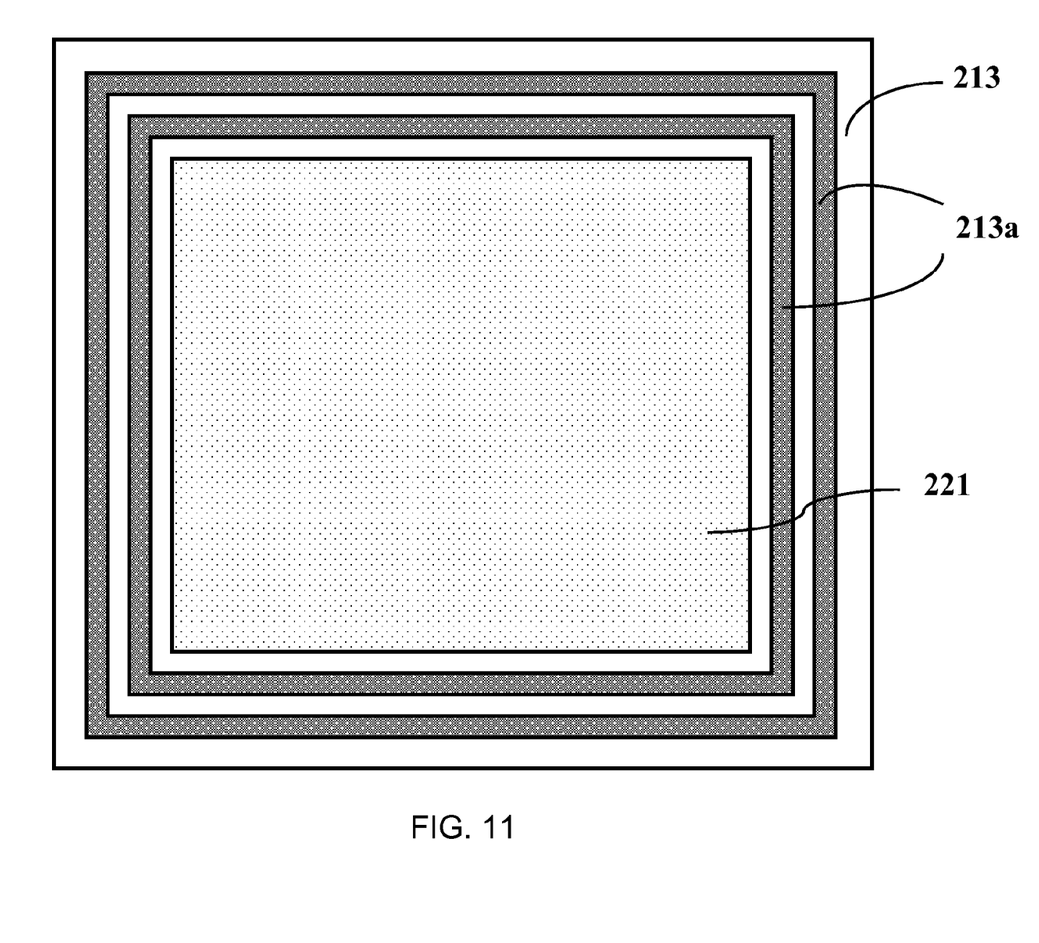
FIG. 11 illustrates a top view for a fourth step.

With reference to FIG. 10, fabricate a reflecting layer 221 in the surrounding region of the well ring structure 213a. The Ag reflecting layer is about 50 nm-500 nm thick. Refer to FIG. 11 for a top view, and FIG. 12 for a sectional view.

Figure 12:
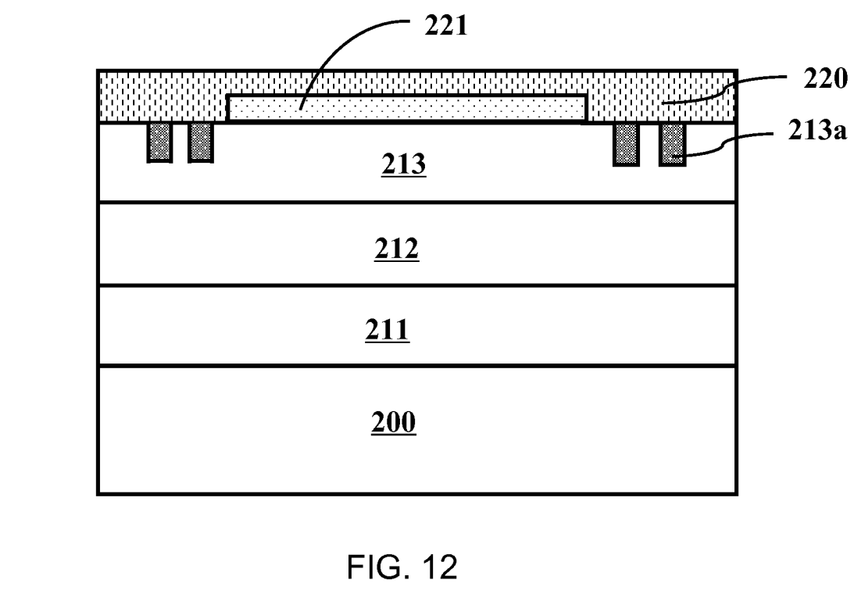
FIG. 12 illustrates a sectional view.

With reference to FIG. 11 and FIG. 12, fabricate a dense metal coating layer 220 over the well ring structure 213a and the reflecting layer 221; the metal coating layer is about 200 nm-2000 nm thick and forms ohmic contact between the metal and the P-type layer after metal layer melting under high temperature. The material of metal the coating layer is TiW preferably and can be metal layer comprising one or two elements of Ti, Pt, W, Al, Au, Ni, Sn and Cr.

The chip can be further processed. For example, fabricate the chip pattern with dry etching and etch it to the N-layer semiconductor; fabricate electrodes over the N-layer semiconductor, and the metal coating layer which is TiAu preferably and can be metal layer comprising one or two elements of Ti, Pt, W, Al, Au, Ni, Sn and Cr; cover an insulating and packaging passivation layer outside the electrode; grind or thin the chip and make it unified; and bond the supporting substrate 240 via flip chip technology to form the light-emitting device as shown in FIG. 2.

Detailed descriptions will be provided below with respect to various embodiments of the well ring structure, with reference to FIGS. 3-7 (Embodiments 1-5).

Embodiment 1

Figure 3:
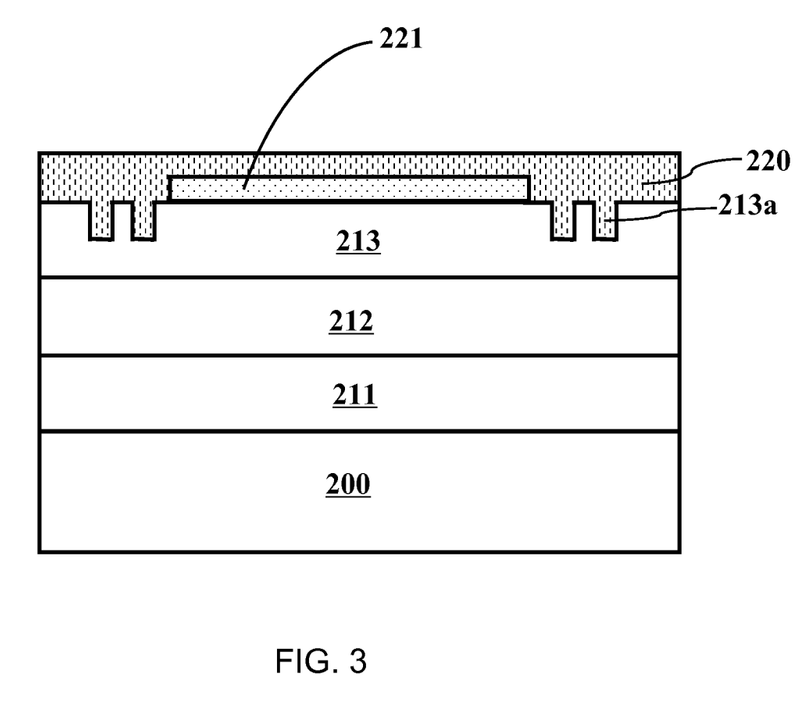
FIG. 3 is a structural diagram of a device according to Embodiment 1.

In this embodiment, define the position and size of the Ag reflecting layer; form a groove well ring 213a surrounding the Ag reflecting layer inside the p-type semiconductor layer via dry etching not deeper than 100 nm and not wider than 20 µm; fabricate the Ag reflecting layer 221 over the p-type semiconductor surrounded by the groove well ring 213a; fabricate the dense metal coating layer 220, about 200 nm-2000 nm thick, over the well ring layer and the reflecting layer to fill in the well ring structure 213a and to form good ohmic contact with the entire P-type layer. Refer to FIG. 3 for a cross-sectional view. The metal coating layer 220 is TiW preferably and can be metal layer comprising one or two elements of Ti, Pt, W, Al, Au, Ni, Sn and Cr. In this embodiment, an ohmic contact is formed between the P-type semiconductor of the entire well ring structure and the metal coating layer, so as to form "pining" effect surrounding the Ag reflecting layer and prevent Ag migration.

Embodiment 2

Figure 4:
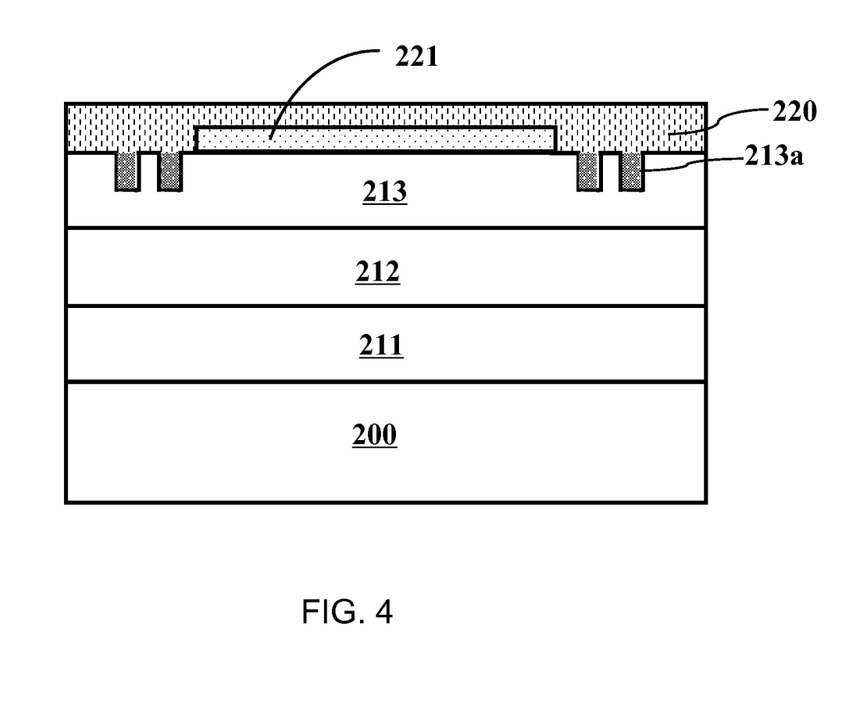
FIG. 4 is a structural diagram of a device according to Embodiment 2.

As shown in FIG. 4, the difference between this embodiment and Embodiment 1 is that; after fabrication of the groove well ring 213a, insulating material like $SiO_2$ and SiN can be filled in the groove well ring 213a. Increase the potential inside the groove well ring with insulating material to prevent the Ag from lateral migration to the N-type semiconductor.

Embodiment 3

Figure 5:
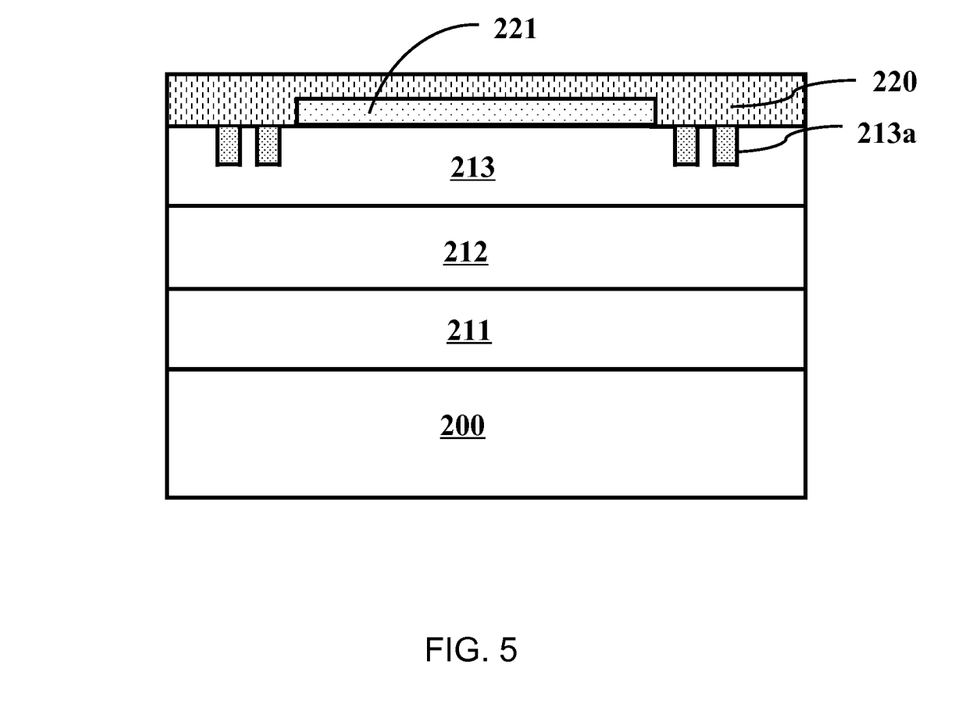
FIG. 5 is a structural diagram of a device according to Embodiment 3.

With reference to FIG. 5, define position and size of the Ag reflecting layer and form a high-resistance structure in the region where the p-type semiconductor layer surrounds the reflecting layer via ion injection so as to form a well ring structure 213a; fabricate the Ag reflecting layer 221 over the P-type semiconductor surrounded by the groove well ring 213a; fabricate the dense metal coating layer 220 over the well ring structure 213a and the Ag reflecting layer 221. Increase the potential inside the groove well ring with insulating material, together with good ohmic contact outside the well ring, to prevent the Ag from lateral migration to the N-type semiconductor from the edge.

Embodiment 4

Figure 6:
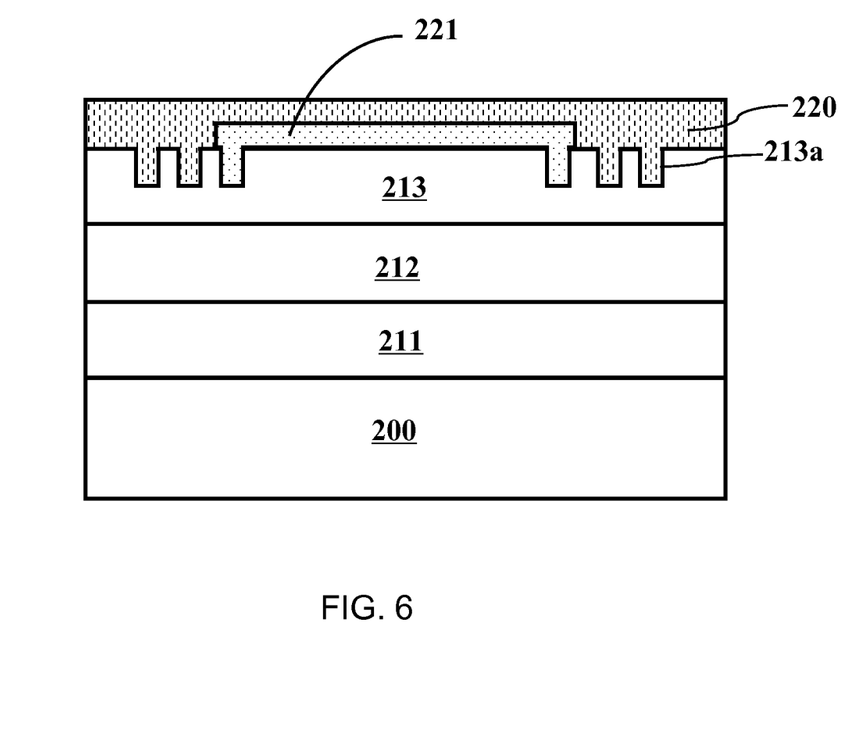
FIG. 6 is a structural diagram of a device according to Embodiment 4.

With reference to FIG. 6, in this embodiment, three groove well rings 213a are formed inside the p-type semiconductor layer; the reflecting layer 221 forms over the p-type semiconductor layer surrounded by the groove well ring and fills in the first inner ring; the metal coating layer 220 covers on the reflecting layer and fills in the other two groove well rings of the other two rings. Divide the periphery Ag reflecting layer into several small regions to improve the coverage of the reflecting layer edge and reduce the lateral migration dense.

Embodiment 5

Figure 7:
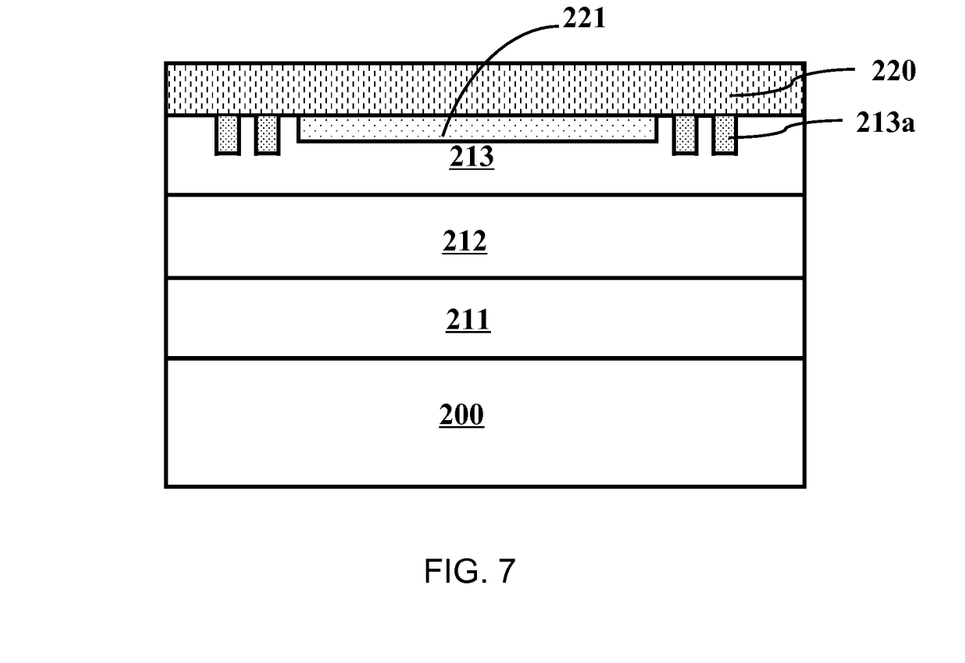
FIG. 7 is a structural diagram of a device according to Embodiment 5.

With reference to FIG. 7, in this embodiment, the reflecting layer 221 is embedded in the surface layer of the p-type semiconductor layer 213. In this way, the metal coating layer entirely wraps the Ag reflecting layer and forms good ohmic contact with the P-type semiconductor outside the groove.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A semiconductor light-emitting device configured to prevent metal migration, comprising:
   a multi-layer light-emitting structure including an n-type semiconductor layer, a light-emitting layer, and a p-type semiconductor layer;
   a reflecting layer disposed over the p-type semiconductor layer and containing a metal that tends to migrate;
   a well ring structure at the p-type semiconductor layer and substantially surrounding the reflecting layer to prevent the metal from migrating towards a side wall; and
   a metal coating layer over the reflecting layer and extending towards the well ring structure to form an ohmic contact with the p-type semiconductor of substantially the entire well ring structure,
   wherein in the p-type semiconductor layer, a resistance inside the well ring structure is higher than a resistance outside the well ring structure.

2. The device of claim 1, wherein the well ring structure is formed in the p-type semiconductor layer based on a size of the reflecting layer, and the well ring structure is no deeper than 150 nm and no wider than 20 μm.

3. The device of claim 1, wherein the well ring structure comprises one or more rings surrounding the reflecting layer.

4. The device of claim 1, wherein the well ring structure is formed in a groove structure of the p-type semiconductor layer.

5. The device of claim 4, wherein the groove structure is filled with an insulating material.

6. The device of claim 1, wherein the metal coating layer has a thickness of about 200 nm-2000 nm and fills the well ring structure and forms a good ohmic contact with substantially the entire p-type layer.

7. The device of claim 1, wherein the metal coating layer comprises at least one of Ti, Pt, W, Au, Ni, Sn, or Cr.

8. The device of claim 1, wherein the well ring structure is formed via ion injection to form a high-resistance structure in a region of the reflecting layer surrounded by the p-type semiconductor layer.

9. A lighting system comprising a plurality of semiconductor light-emitting devices configured to prevent metal migration, each device comprising:
   a multi-layer light-emitting structure including an n-type semiconductor layer, a light-emitting layer, and a p-type semiconductor layer;
   a reflecting layer disposed over the p-type semiconductor layer and containing a metal that tends to migrate;
   a well ring structure at the p-type semiconductor layer and substantially surrounding the reflecting layer to prevent the metal from migrating towards a side wall of the device; and
   a metal coating layer over the reflecting layer and extending towards the well ring structure to form an ohmic contact with the p-type semiconductor of substantially the entire well ring structure,
   wherein in the p-type semiconductor layer, a resistance inside the well ring structure is higher than a resistance outside the well ring structure.

10. The system of claim 9, wherein the well ring structure is formed in the p-type semiconductor layer based on a size of the reflecting layer, and the well ring structure is no deeper than 150 nm and no wider than 20 μm.

11. The system of claim 9, wherein the well ring structure comprises one or more rings surrounding the reflecting layer.

12. The system of claim 9, wherein the well ring structure is formed in a groove structure of the p-type semiconductor layer.

13. The system of claim 12, wherein the groove structure is filled with an insulating material.

14. The system of claim 9, wherein the metal coating layer has a thickness of about 200 nm-2000 nm and fills the well ring structure and forms a good ohmic contact with substantially the entire p-type layer.

15. The system of claim 9, wherein the metal coating layer comprises at least one of Ti, Pt, W, Au, Ni, Sn, or Cr.

16. The system of claim 9, wherein the well ring structure is formed via ion injection to form a high-resistance structure in a region of the reflecting layer surrounded by the p-type semiconductor layer.

* * * * *